United States Patent
Xin et al.

(10) Patent No.: US 11,589,462 B2
(45) Date of Patent: Feb. 21, 2023

(54) SEMI-FLEXIBLE COMPONENT CARRIER WITH STEPPED LAYER STRUCTURE

(71) Applicant: AT&S (China) Co. Ltd., Shanghai (CN)

(72) Inventors: Nick Xin, Shanghai (CN); Mikael Andreas Tuominen, Pernio (FI); Seok Kim Tay, Singapore (SG)

(73) Assignee: AT&S(China) Co. Ltd., Shanghai (CN)

( * ) Notice: Subject to any disclaimer, the term of this patent is extended or adjusted under 35 U.S.C. 154(b) by 0 days.

(21) Appl. No.: 17/309,069

(22) PCT Filed: Apr. 30, 2019

(86) PCT No.: PCT/CN2019/085337
§ 371 (c)(1),
(2) Date: Apr. 20, 2021

(87) PCT Pub. No.: WO2020/087898
PCT Pub. Date: May 7, 2020

(65) Prior Publication Data
US 2022/0039259 A1      Feb. 3, 2022

(30) Foreign Application Priority Data
Oct. 31, 2018   (CN) .................. 201821787816.3

(51) Int. Cl.
*H05K 1/14*    (2006.01)
*H05K 1/03*    (2006.01)
*H05K 3/46*    (2006.01)

(52) U.S. Cl.
CPC ........... *H05K 1/144* (2013.01); *H05K 1/0393* (2013.01); *H05K 3/4691* (2013.01); *H05K 2201/09036* (2013.01); *H05K 2201/09845* (2013.01)

(58) Field of Classification Search
CPC ................. H05K 1/144; H05K 1/0393; H05K 2201/09038; H05K 2201/09845
See application file for complete search history.

(56) References Cited

U.S. PATENT DOCUMENTS

| | | |
|---|---|---|
| 4,338,149 A | 7/1982 | Quaschner |
| 4,931,134 A | 6/1990 | Hatkevitz et al. |

(Continued)

FOREIGN PATENT DOCUMENTS

| | | |
|---|---|---|
| CN | 101547551 A | 9/2009 |
| CN | 104486903 A | 4/2015 |

(Continued)

*Primary Examiner* — Hoa C Nguyen
(74) *Attorney, Agent, or Firm* — Robert A. Blaha; Smith Tempel Blaha LLC

(57) ABSTRACT

A semi-flexible component carrier includes a stack having at least one electrically conductive layer structure and at least one electrically insulating layer structure. The layer structures are stacked on top of each other in a stacking direction s. A recess extends from a first main surface of the stack into the stack and extends only partially into one of the at least one electrically insulating layer structure so that an electrically insulating layer structure having a stepped portion is formed. The stepped portion provides a flexible region of the stack with respect to a rigid region of the stack.

19 Claims, 6 Drawing Sheets

(56) References Cited

U.S. PATENT DOCUMENTS

| | | | | |
|---|---|---|---|---|
| 5,219,640 | A * | 6/1993 | Gazit | H05K 1/028 |
| | | | | 428/209 |
| 9,402,307 | B2 * | 7/2016 | Otsubo | H05K 1/0278 |
| 2010/0025086 | A1 | 2/2010 | Stahr et al. | |
| 2010/0051325 | A1 * | 3/2010 | Sato | H05K 3/4652 |
| | | | | 174/254 |
| 2015/0053463 | A1 | 2/2015 | Chen et al. | |
| 2016/0095207 | A1 * | 3/2016 | Taniguchi | H05K 3/4691 |
| | | | | 174/252 |
| 2017/0265298 | A1 | 9/2017 | Zhang et al. | |

FOREIGN PATENT DOCUMENTS

| | | |
|---|---|---|
| CN | 105657959 A | 6/2016 |
| CN | 109076695 A | 12/2018 |
| WO | 2017167875 A1 | 10/2017 |

\* cited by examiner

SEMI-FLEXIBLE COMPONENT CARRIER WITH STEPPED LAYER STRUCTURE

CROSS-REFERENCE TO RELATED APPLICATION

The present application is a U.S. national phase application that emerged from the International Application No. PCT/CN2019/085337 filed Apr. 30, 2019, which designated the U.S., and claimed priority to China Utility Model Application No. 201821787816, filed with the China National Intellectual Property Administration on Oct. 31, 2018, the entire contents of which is incorporated herein by reference in its entirety.

TECHNICAL FIELD

Embodiments of the invention relates to a component carrier.

TECHNOLOGICAL BACKGROUND

Semi-flexible component carriers, such as semi-flexible printed circuit boards (PCB) or substrates, have both rigid and flexible regions. Such component carriers may be bent along the flexible region so that different rigid regions, which are connected by the flexible region, can be conveniently arranged with respect to each other. In other words, semi-flexible component carriers allow for considerable freedom with respect to the packaging geometry.

A typical method for manufacturing semi-flexible component carriers starts from a multilayer stack comprising both rigid and flexible layers. In flexible regions of the component carrier, the rigid layers of the stack are removed so that only the flexible layers remain. This can be achieved for example by laser routing. Since such processes are commonly not very accurate, there is a danger that the flexible layers in the flexible region of the component carrier are damaged in the process of removing the rigid layers. This damage may lead to cracks or fractures in the flexible region, when it is submitted to mechanical stress, e.g. during bending.

Furthermore, edges of a recess delimiting a flexible region of the component carrier are commonly located in a transition region between layers. When the component carrier is bent in the flexible region, these edges may experience particularly large mechanical stress, which may also lead to mechanical damage to the component carrier, in particular to cracks or fractures emanating from these edges or to the detachment of layers in the transition region.

Thus, there may be a need for a semi-flexible component carrier, in which the danger of cracks and fractures occurring in the flexible region of the component carrier is greatly reduced.

SUMMARY

According to a first aspect, a semi-flexible component carrier comprises (i) a stack comprising at least one electrically conductive layer structure and at least one electrically insulating layer structure, wherein the layer structures are stacked on top of each other in a stacking direction, and (ii) a recess extending from a first main surface of the stack into the stack and extending only partially into one of the at least one electrically insulating layer structure so that an electrically insulating layer structure having a stepped portion is formed, wherein the stepped portion provides a flexible region of the stack with respect to a rigid region of the stack.

OVERVIEW OF EMBODIMENTS

In the context of embodiments of the present invention, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a "stack" of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane. The "stacking direction" of the component carrier or stack extends along the surface normal of the main surfaces of the layers and the main surfaces of the stack. A "main surface" of a layer or a stack is either one of the two surfaces, which have by far the largest extension compared with the other surfaces.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board and a substrate (in particular an IC substrate).

In the context of embodiments of the present invention, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg such as FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the stack may comprise "rigid" (or stiff) as well as "flexible" (or pliable) layer structures. In the present context, both rigidity and flexibility of an object refer to the extent to which the object resists deformation in response to forces which are applied to the object. The difference may be interpreted in a relative manner in that rigid layers deform considerably less in response to typical forces during manufacture and use of the component carrier compared with flexible layers. Rigidity and flexibility can also be understood in an absolute sense that rigid layers deform only slightly when typical forces are applied, while flexible layers deform considerably in comparison to the rigid layers. In other words, when applying the same bending force, flexible layers are configured to be bent, while rigid layers are not configured to be bent. Flexible layers can be deformed considerably, before any mechanical damage occurs, such as cracks or fractures. They may be deformable only a small number of times, in particular only once, or they may be deformable a large number of times.

The rigid and flexible layer structures define "rigid portions" and "flexible portions" of the stack or component carrier when viewed in stacking direction. A flexible portion may consist of only flexible layer structures, while any portion may be considered as rigid that comprises at least one rigid layer structure. The flexible layer structures of a stack may be inner layer structures of the stack and/or outer layer structures of the stack. Core layer structures comprising FR4 may be rigid layer structures, while resin coated foil layer structures may be flexible layer structures.

The stack may also comprise "rigid regions" and "flexible regions" extending in a direction substantially perpendicular to the stacking direction. By definition, these regions comprise all the layers that are present in those regions in stacking direction. A flexible region may result in a twofold way, first because the thickness of the stack in stacking direction is considerably smaller than the thickness of the rigid regions and second because in the flexible region at least some of the rigid layer structures have been removed, while possibly some flexible layer structures have been added. If some layer structures are removed, typically a "recess" is formed in the stack, which defines or delimits the flexible region of the component carrier.

Like for the distinction between rigid and flexible layers, the distinction between rigid and flexible regions can be understood in a relative or an absolute manner. Rigid regions deform considerably less if forces of a magnitude typical for manufacture and usage of the component carrier are applied, if compared with flexible regions. Flexible regions are configured to be bent elastically, while rigid regions are not configured to be bent. Thus, flexible regions can be deformed considerably, before any mechanical damage occurs, such as cracks or fractures. Flexible regions may be deformable only a small number of times, in particular only once, or they may be deformable a large number of times.

In the context of embodiments of the invention, a "stepped portion" denotes a geometrical profile of a surface, e.g. of a layer or a stack, characterized by at least one step. In particular, the stepped portion may be formed by two opposing steps which lead away from each other, thereby providing a recess or hollow portion between the two steps. It may also be delimited by two steps leading in the same direction. Thus, a recess may comprise a stepped portion, if in stacking direction the recess comprises at least two different diameters or extensions, wherein in a transition section or region the at least one step is formed.

By forming a recess that extends only partially into one of the at least one electrically insulating layer structures of a stack and thereby forming a stepped portion in that insulating layer structure, the danger of cracks in or next to the flexible region may be greatly reduced. Of course, the stepped portion may also be formed in an electrically conductive layer structure or extend over both electrically insulating and electrically conductive layer structures.

One advantage of such a stepped portion in a respective layer structure within a recess is that the edges and/or corners of the corresponding stepped recess are formed within one layer rather than between layers. When bending the flexible region, these corners and edges may experience particularly large mechanical stress. If the corners and edges are located in the transition region between layers, cracks and fractures are more likely to occur, due to inhomogeneities which are typically present in the transition region between layers. Furthermore, if the edges and corners lie in the transition region between layers, a peeling-off, detachment or separation of the respective adjacent layers is more likely to occur. Thus, forming a recess that ends in a stepped portion of an electrically insulating layer structure is advantageous for the stability and reliability of the semi-flexible component carrier.

Furthermore, the stepped portion may result from and reflect a specific and advantageous method, with which the recess of the semi-flexible component carrier has been formed. In particular, the stepped portion in the insulating layer structure may correspond to the volume of a release layer that was present during part of the production process of the component carrier, but which was eventually removed. Given that release layers are generally configured to be easily removed from adjacent layer structures, the removal of the release layer is unlikely to cause any damage to the exposed surface of the stepped portion, such as grooves or indentations. This is advantageous, since such grooves or indentations constitute inhomogeneities which can be the origin of further mechanical damage of the component carrier, such as cracks, fissures or fractures, if the component carrier is submitted to mechanical stress, in particular if its flexible region is bent. Thus, the presence of the stepped portion, if it corresponds to the volume or region of a release layer that was used during manufacturing of the component carrier, contributes to the stability and reliability of the semi-flexible component carrier.

According to a further exemplary embodiment, a flexible layer is arranged above a second main surface of the stack, opposite the first main surface, wherein the flexible layer is arranged in the flexible region. Such an additional flexible layer reinforces the flexible region and thus improves the reliability of the semi-flexible component carrier, while at the same time the flexibility of the flexible region is not or only slightly affected or may even be enhanced.

According to a further exemplary embodiment, the flexible layer comprises a flexible ink layer. Flexible ink is known to have particularly suitable characteristics for improving the reliability and flexibility of the flexible region of the stack. It is also easily applied during manufacture of the component carrier.

According to a further exemplary embodiment, a bending stress handling layer extends in the flexible region of the stack. The bending stress handling layer may extend not only over the flexible region but also over or into the rigid region of the stack. Such a bending stress handling layer is a flexible layer that is particularly configured to absorb mechanical stress during a bending of the flexible region of the stack. It may comprise elastic material that can be easily deformed without any cracks or fractures occurring in the layer and adjacent regions. In combination with the other layer structures of the flexible region, the bending stress handling layer also contributes to the stability and reliability of the flexible region.

According to a further exemplary embodiment, the bending-stress handling layer comprises at least one of the group consisting of resin coated foil (RCF), resin coated copper (RCC) and polyimide (PI). The bending stress handling layer may comprise a resin coated foil, in particular a resin coated copper foil. Such resin coated foils have particularly suitable properties for forming a flexible layer that can absorb and handle mechanical stress during bending without being damaged. Polyimides are known for their excellent properties in terms of e.g. thermal stability, chemical resistance and mechanical flexibility. However, if the bending stress handling layer does not comprise polyimides, a baking process may not be needed.

According to a further exemplary embodiment, the bending stress handling layer is electrically insulating and arranged between a second main surface of the stack, opposite the first main surface, and the electrically insulating layer structure having the stepped portion. Furthermore, the region between the bending stress handling layer and the electrically insulating layer structure having the stepped portion is free of further electrically insulating layer structures. In particular, the bending stress handling layer may be the only electrically insulating layer structure in the flexible region besides the stepped layer structure and possibly an additional flexible layer on the second main surface of the component carrier. Thus, a simple and compact design of the flexible region comprising only a small number of layers is possible, while at the same time flexibility and reliability are guaranteed.

According to an exemplary embodiment, at least one further stepped portion is formed on at least one of the side-walls of the recess. By contrast, the stepped portion, which was already introduced is formed at the bottom of the recess. Thus, the further stepped portion extends along the stacking direction, while the previously introduced stepped portion extends in a plane that is substantially perpendicular to the stacking direction. The step, at which the further stepped portion begins may be located in a layer other than the electrically insulating layer structure having the previously introduced stepped portion.

The at least one further stepped portion may result from a process, in which the recess is formed. Specifically, the further stepped portion may result from a process of routing, milling or grinding, in particular a process of depth routing. Such a process may be designed to provide a cap removal hole, which meets a preexisting or precutting hole. The cap removal hole is provided to eventually remove a cap of layers from the flexible region, in particular a cap of at least partially rigid layers. Both the precutting holes and the cap removal holes may be formed as cuts, in particular as cuts extending from one lateral edge of the stack to another lateral edge of the stack. The precutting holes or cuts may have a smaller width or extension than the cap removal holes or cuts. The comparably large width of the cap removal hole allows for considerable tolerance in lateral direction concerning the exact position where the cap removal hole is formed while ensuring that the respective precutting hole will be met by the cap removal hole. Obviously, this process leads to a step at the position, where the precutting hole and the cap removal hole meet. This step together with the first main surface of the stack delimits the further stepped portion. Thus, the depth of the cap removal hole corresponds to the depth of the respective further stepped portion.

The presence of the precutting holes allows that the cap removal holes do not have to extend up to the stepped portion, which will eventually form the bottom of the recess. Thus, there is considerable tolerance concerning the exact depth up to which the cap removal holes have to be formed, as long as they meet the precutting holes. Also the cap removal holes can be less deep due to the presence of precutting holes.

According to an exemplary embodiment, the electrically insulating layer structure having the stepped portion comprises pre-impregnated fibers (prepregs). This is advantageous because prepregs are standard materials widely used in the manufacture of component carriers. The use of such materials therefore is efficient and cheap.

According to an exemplary embodiment, a further recess extending partially from the second main surface into the stack is arranged opposite the recess. In other words, the stack and the component carrier have two corresponding recesses extending from opposite sides into the component carrier and leaving a number of layers from the interior of the stack intact. These layers may be flexible such that the flexible region is now provided by flexible layers from the interior of the stack rather than by flexible outer layers, which are flexible layers beneath one of the main surfaces of the stack. Thus, according to this embodiment, inner layers of the stack may be flexible rather than outer layers.

The further recess may be formed in analogy to the recess as previously introduced. In particular, the further recess may comprise a stepped portion as described above. It may also have all other features introduced for the recess and the corresponding stepped portion. The further recess may have the same depth or may be deeper or less deep than the recess. Also, the locations and/or extensions of the recess and the further recess in the plane defined by the main surfaces of the stack may be the same or they may differ.

According to an exemplary embodiment, a surface of the stepped portion exposed towards the first main surface is free of indentations. This feature may result from a process of forming the recess. In particular, the stepped portion may correspond to the volume of a release layer, which is employed during the process and later removed. The combined use of the release layer with the precutting holes allows for the cap removal holes to be formed with considerable tolerance. In particular, the cap removal holes need only reach into the component carrier to an extent that they meet the precutting holes, thereby avoiding the danger that the stepped portion is damaged when forming the cap removal holes. Also, providing the precutting holes does not pose a risk of damage for the surface of the stepped portion, since the layer structure with the stepped portion may be provided after the formation of the precutting holes. Finally, the release layer is explicitly configured for being easily released without damaging the underlying layer structures.

Thus, the surface of the stepped portion exposed towards the first main surface may be free of any damage, such as indentations or grooves, which may result for example from drilling or routing. These damages could lead to cracks or fractures, when the flexible region of which the stepped portion forms part is submitted to mechanical stress. Thus, the stepped portion being free of indentations contributes to the reliability of the flexible region.

According to a further exemplary embodiment, the rigid region comprises a first rigid region arranged adjacent to a first boundary of the flexible region and a second rigid region arranged adjacent to a second boundary of the flexible region opposite the first boundary, wherein an angle between a portion of the first main surface in the first rigid region and a further portion of the first main surface in the second rigid region is unequal to zero.

The "angle" corresponds to the angle between the plane defined by the main surfaces of the first rigid region and the plane defined by the main surfaces of the second rigid region (more exactly, the planes defined by the main surfaces of those parts of the respective rigid regions, which border on a flexible region in between the rigid regions, which parts define the first and second portions of the main surfaces). From a further perspective, the angle corresponds to the angle, with which the flexible region is bent. Furthermore, a "boundary" or transition line of a flexible region denotes an edge of the flexible region which borders on a rigid region.

In particular, when the semi-flexible component carrier is integrated into the housing of an electronic device, there may be a need for different rigid regions of the component carrier to be flexibly located with respect to each other. For example, when the dimensions of the housing are not large enough to include the total width or depth of the component carrier, it may be appropriate to bend the component carrier along the flexible region such that different rigid regions of the component carrier are arranged with an angle unequal to zero with respect to each other. In this way, the compact carrier may fit into a small-sized housing. Thus, arranging different rigid regions with an angle unequal to zero, i.e. bending the component carrier along a flexible region, allows for a compact arrangement of the component carrier.

According to an exemplary embodiment, the angle α between the portion and the further portion of the first main surface is greater than 5 degrees or smaller than −5 degrees. In particular, the angle may be greater than 5 degrees and smaller than 360 degrees or smaller than −5 degrees and larger than −360 degrees. In particular, the angle may be 180 degrees, at which point the different rigid regions are placed on top of each other such that the second main surface of the first rigid region faces the second main surface of the second rigid region or the angle may be −180 degrees, such that the first main surface of the first rigid region faces the first main surface of the second rigid region. This provides a particularly compact arrangement.

According to an exemplary embodiment, the electrically insulating layer structure having the stepped portion comprises a protrusion, wherein the protrusion at least partially delimits the stepped portion.

A "protrusion" or projection may extend from a bottom surface of the stepped portion. The protrusion may form an edge of the recess defining the stepped portion. The protrusion may extend between a bottom surface of the stepped portion and a main surface of the electrically insulating layer surrounding the recess. Hence, the bottom surface and the main surface are spaced from each other and the protrusion extends between each other. Furthermore, since the protrusion forms an edge of the recess, the free end of the protrusion may form part of the mains surface of the electrically insulating layer. The protrusion may protrude in stacking direction along one or several insulating layer structures and/or conductive layer structures.

The protrusion may have various geometrical forms, in particular the form of a tapered boundary/edge or tapered wall becoming thinner with distance from the bottom surface of the insulating layer structure having the stepped portion. It may jut out at a sharp angle. The protrusion may extend along an edge of the stepped portion, wherein the protrusion can have for example a triangular profile or a quadrangular profile or a profile in the shape of a polygon with five, six, seven, eight, nine, ten or more than ten vertices. The protrusion may have a round edge on the side facing the stepped portion, in particular an edge in the form of a quarter circle. A protrusion may be formed by two steps facing in opposite directions. These steps can but need not have the same height.

The protrusion, in particular a lateral surface of the protrusion, may delimit at least partially the stepped portion. The stepped portion may be delimited at two opposing sides by respective protrusions or it may be delimited on all sides by one or several protrusions. These protrusions may have the same or different forms.

According to an exemplary embodiment, a lateral surface of the protrusion forming at least a part of a sidewall of the stepped portion is inclined with respect to a bottom surface of the stepped portion.

The inclined lateral surface may fully or at least partially surround and hence delimit the stepped portion of the electrically insulating layer having the stepped portion. The inclined lateral surface may be the entire lateral surface on the respective side of the protrusion or may be only a part of the entire lateral surface. The inclined lateral surface may form an angle with the bottom surface of the stepped portion, which is larger than a right angle, in particular larger than 91° and smaller than 179°, more in particular larger than 120° and smaller than 150°. A further lateral surface of the protrusion opposite the lateral surface may be inclined in an opposite way with respect to the bottom surface, i.e. with an angle smaller than a right angle, in particular smaller 89° and larger than 1°, more in particular smaller than 85° and larger than 5°.

The inclination of the lateral surface and/or the inclination of the further lateral surface may result from laser drilling or laser cutting for cutting at least partially the recess, which may lead to a conical hole or a cut with a substantially triangular profile, possibly with a truncated or rounded tip. In particular, the protrusion may result from a precutting hole being filled with resin, when an electrically insulating layer structure is laminated over the precutting hole.

According to an exemplary embodiment, the protrusion comprises a plateau surface, wherein the stacking direction s is substantially orthogonal to the plateau surface.

The plateau surface may be formed on top of the protrusion or it may be formed in that lateral surface of the protrusion, which faces or borders on the stepped portion of the electrically insulating layer having the stepped portion. In the latter case, the protrusion may extend beyond the plateau surface. For example, if the protrusion has the shape of a tapered wall, then the plateau surface may form the tip of the tapered wall. However, the tapered wall may also protrude beyond the plateau surface being arranged at a lateral surface of the tapered wall, in particular that lateral surface, which faces the stepped portion.

The plateau surface may be orthogonal to the stacking direction of the stack of layer structures, which the semi-flexible component carrier comprises. It may be substantially orthogonal to a side wall of the recess. It may be substantially parallel to the electrically insulating layer structure having the stepped portion.

The plateau surface may be formed by a depth routing process. It may correspond to a part of the bottom surface of a cap removal hole, wherein the cap removal hole may be formed by the depth routing process. The plateau surface may meet the inclined lateral surface and/or the inclined further lateral surface. It may in particular meet the inclined lateral surface at a position, where a release layer had been present.

According to an exemplary embodiment, the plateau surface has greater roughness than the lateral surface. "Roughness" quantifies the deviations of a real surface from its ideal form in direction of the normal vector of the real surface. A surface with larger and more deviations is rougher than a surface with smaller and less deviations. Roughness may refer to a conventional roughness measure such as Ra, which denotes the arithmetical mean height of the deviations of the assessed profile, i.e. the average of the absolute values of the deviations along a sampling length.

The greater roughness of the plateau surface in comparison to the roughness of the lateral surface may be due to the processes from which these surfaces result. The plateau surface may result from a depth routing process, which typically leaves substantial indentations and/or scratches in the surfaces of the resulting hole. By contrast, the lateral surface may result from a filling process, during which the lateral surface of the filling material contacts a release layer. During this filling process, the release layer may have a particularly smooth surface, in turn resulting in a smooth lateral surface. Furthermore, the release layer may be configured so that no particular damage to the lateral surface is to be expected during the process of removing the release layer as well as during the process of removing other material adjacent to the release layer, in particular material of a cap, which is removed from a recess.

According to an exemplary embodiment, the protrusion and a portion of the electrically insulating layer structure, from which the protrusion protrudes, are integrally formed by a resin material.

The portion of the electrically insulating layer structure, from which the protrusion protrudes, may be a portion, which is located beneath the protrusion in the electrically insulating layer structure. The portion may be located beneath a main surface of the electrically insulating layer structure, from which main surface the protrusion protrudes. In particular, it may be located beneath a bottom surface of the stepped portion.

The protrusion may be formed during lamination of the electrically insulating layer structure having the protrusion onto a release layer and onto one or more precutting holes. During lamination, material, in particular resin, may flow from the electrically insulating layer structure into the one or more precutting holes. This material may fully or at least partially fill the one or more precutting holes, wherein at least part of the material filling a precutting hole may eventually form a respective protrusion. Due to this process, the protrusion and the portion of the electrically insulating layer structure, from which the protrusion protrudes, may be integrally formed by the same material, in particular by a resin material. A material may be continuous in all or at least one of the components of the material between the protrusion and the portion, from which the protrusion protrudes.

According to an exemplary embodiment, the portion, from which the protrusion protrudes, comprises reinforcement fibers.

Reinforcement fibers may be any fibers that stabilize the structure, of which the reinforcement fibers form part, in particular a layer structure. Reinforcement fibers may in particular be fibers of a so-called pre-preg material which can be used as a material for the electrically insulating layer structure having the stepped portion.

The protrusion may be free of such reinforcement fibers or comprise less density of reinforcement fibers with respect to the portion of the electrically insulating layer structure, from which the protrusion protrudes. This is because during the process described with respect to the previous embodiment, the reinforcement fibers may not enter or at least may not substantially enter into the precutting holes. This may be, because the reinforcement fibers are interwoven and form e.g. a pre-preg, in a manner such that they will not enter into the precutting holes during lamination. However, the reinforcement fibers will be present in the portion of the electrically insulating layer structure, from which the protrusion protrudes, just like in other portions of the electrically insulating layer structure. Thus, the density of reinforcement fibers in the protrusion may be much smaller than the density of reinforcement fibers in the electrically insulating layer structure, of which the protrusion forms part.

In an embodiment, the at least one electrically insulating layer structure comprises at least one of the group consisting of resin (such as reinforced or non-reinforced resins, for instance epoxy resin or Bismaleimide-Triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based Build-Up Film, polytetrafluoroethylene (Teflon), a ceramic, and a metal oxide. Teflon® is a registered mark of The Chemours Company FC LLC of Wilmington, Del., U.S.A. Reinforcing materials such as webs, fibers or spheres, for example made of glass (multilayer glass) may be used as well. Although prepreg particularly FR4 are usually preferred for rigid PCBs, other materials in particular epoxy-based Build-Up Film for substrates may be used as well. For high frequency applications, high-frequency materials such as polytetrafluoroethylene, liquid crystal polymer and/or cyanate ester resins, low temperature cofired ceramics (LTCC) or other low, very low or ultra low DK-materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the at least one component, which the component carrier is capable of accommodating, can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection, an electronic component, or combinations thereof). For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

In an embodiment, the substrate or interposer may consist of at least a layer of glass, Silicon (Si) or a photoimageable or dry-etchable organic material like epoxy-based Build-Up films or polymer compounds like Polyimide, Polybenzoxazole, or Benzocyclobutene.

According to a further aspect, a method of forming a semi-flexible component carrier is described. The method comprises (i) forming a stack comprising at least one electrically conductive layer structure and at least one electrically insulating layer structure, wherein the layer structures are stacked on top of each other in a stacking direction s; and (ii) forming a recess extending from a first main surface of the stack into the stack and extending only partially into one of the at least one electrically insulating layer structure so that an electrically insulating layer structure having a stepped portion is formed, wherein the stepped portion provides a flexible region of the stack with respect to a rigid region of the stack.

According to an exemplary embodiment of the method, forming the recess comprises (i) forming at least one precutting hole extending partially through the stack so that the precutting hole defines the stepped portion;

(ii) applying a release layer at the stepped portion, wherein the release layer contacts the precutting hole; and (iii) forming at least one cap removal hole extending from the first main surface of the stack so that the cap removal hole contacts the precutting hole.

The precutting hole may be formed by laser drilling or laser cutting or by mechanical drilling. The cap removal hole may be formed by a depth routing process. The width of the cap removal hole may be larger than the width of the precutting hole. The precutting hole, which is contacted or met by the cap removal hole, may either be kept free of filling material or it may be filled with a material, in particular with resin. In the latter case, an inner surface of the precutting hole may be covered by a portion of the material forming e.g. the release layer. The cap removal hole may meet a portion of the release layer. The cap removal hole may be required not to meet or contact the release layer except at the mentioned portion of the release layer.

The one or more cap removal holes together with the one or more precutting holes and the release layer may enclose and hence define a cap. The cap may be easily releasable or removable from the component carrier, of which the cap originally forms part. The cap may be easily removable because the cap may be delimited only by hollow space or holes and by the release layer. The release layer may be configured such that adjacent material being in contact with the release layer can be easily released or removed from the adjacent material. Removing the cap from the component carrier may provide the recess in the stack and the electrically insulating layer, respectively, which may define the flexible portion of the component carrier.

The aspects defined above and further aspects are apparent from the examples of embodiment to be described hereinafter and are explained with reference to the examples of embodiment. The invention will be described in more detail hereinafter with reference to examples of embodiment but to which the invention is not limited.

DETAILED DESCRIPTION EXEMPLARY EMBODIMENTS

Figure 1:
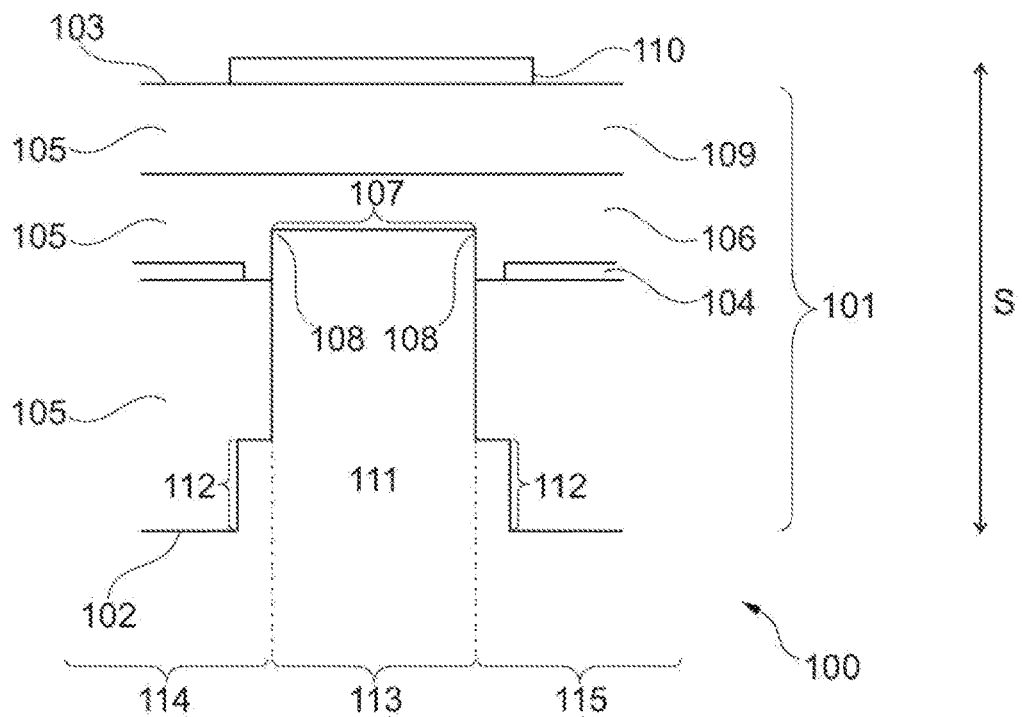
FIG. 1 illustrates a schematic cross-sectional view of a semi-flexible component carrier according to an exemplary embodiment of the invention.

The illustrations in the drawings are schematically presented. In different drawings, similar or identical elements are provided with the same reference signs.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different from those illustrated in the figures when in use.

Before, referring to the drawings, exemplary embodiments will be described in further detail, some basic considerations will be summarized based on which exemplary embodiments of the invention have been developed.

Embodiments of the invention have been developed in view of problems regarding cap removal on semi-flexible PCBs (semi-flexible component carriers) resulting from problems in depth control and consequent damage of the flexible region, in particular with the aim to provide a cap removal process without damage to the flexible region on semi-flexible PCBs. The cap removal work flow according to embodiments of the invention is the following: 1. Lamination of two core layers using a prepreg layer (which are all layer structures of the stack); 2. Laser precutting, e.g. by laser drilling (to form precutting holes); 3. Release ink printing (to form a release layer); 4. Prepreg (PP) and resin coated foil (RF) lamination (to form an electrically insulating layer having a stepped portion and/or a bending stress handling layer); 5. Flexible ink screen printing on the top of the flex area (to form a flexible layer); 6. Depth routing for de-cap (to form cap removal holes); 7. Cap removal. This cap removal work flow combines laser pre-cutting with a highly accurate depth control process. It introduces laser-precutting plus a depth-routing process and combines it with release layer printing technology.

An advantage may be that more tolerance in depth routing is possible and the risk of a damage to the flex area (flexible region) is eliminated. Further advantages may be that only standard materials are used, for example materials that are halogen-free. Also, with a buildup of only one or two flexible layers, very thin stackups are possible. Furthermore, a polyimide-free buildup is possible and therefore no baking process is needed in manufacture. Still further, the flexible layers (in particular the electrically insulating layer having a stepped portion and/or the bending stress handling layer) are not damaged during manufacture which increases the bending performance. Finally, the HDI (High-Density-Interconnect) design rules remain the same, also in the flexible layers.

FIG. 1 shows an embodiment of the invention. According to this embodiment, a semi-flexible component carrier 100 comprises a stack 101 comprising at least one electrically conductive layer structure 104 and at least one electrically insulating layer structure 105, wherein the layer structures are stacked on top of each other in a stacking direction s. Furthermore, the semi-flexible component carrier comprises a recess 111 extending from a first main surface 102 of the stack into the stack 101 and extending only partially into one of the at least one electrically insulating layer structure. Thereby, an electrically insulating layer structure 106 having a stepped portion 107 is formed, wherein the stepped portion 107 provides a flexible region 113 of the stack with respect to a rigid region 114, 115 of the stack.

Both the flexible region 113 and the rigid region 114, 115 extend in a plane perpendicular to the stacking direction s. All layers present in stacking direction in a flexible region belong to the flexible region 113 and all layers present in stacking direction in a rigid region belong to the rigid region 114, 115. All layers in a flexible region 113 should to some extent be flexible, if only due to their thinness. By contrast, at least one layer in a rigid region 114, 115 should be rigid.

The recess 111 may extend through one or through a plurality of layer structures. It is delimited by the stepped portion 107 and by sidewalls which may extend substantially along the stacking direction s. The recess 111 has edges or corners 108, where the sidewalls meet the bottom of the recess. These edges or corners coincide with edges or corners 108 of the stepped portion 107 of the electrically insulating layer 106.

In the sidewalls, at least one further stepped portion 112 may be formed, which extends from a respective step in the sidewall up to the first main surface of the stack 101. In other words, the step delimits the further stepped portion 112 in stacking direction s towards the second main surface. In particular, there may be a further stepped portion 112 for each sidewall of the recess. The extensions of these further stepped portions 112 may be the same, but they may also differ. In particular, the steps defining the respective stepped portions may have a different height, they may also be located at different positions in stacking direction. The at least one further stepped portion 112 extends in a different direction, namely along the sidewalls of the recess 111, compared with the stepped portion 107, which extends along the bottom of the recess 111.

A flexible layer 110 may be formed on top of a second main surface 103 of the stack 101, opposite the first main surface 102. This flexible layer 110 may extend over a portion of the flexible region 113, the whole flexible region 113, or the whole flexible region 113 and a portion of the rigid region 114, 115. The flexible layer 110 may comprise a flexible ink layer.

Furthermore, a bending stress handling layer 109 may be provided, which is configured to absorb or handle mechanical stress occurring for example during bending of the flexible region 113. The bending stress handling layer 109 may comprise resin coated foil (RCF), resin coated copper (RCC) and/or polyimide (PI). The bending stress handling layer 109 may extend over a portion of the flexible region 113, the whole flexible region 113, or the whole flexible region 113 and a portion of the rigid region 114, 115. Accordingly, the layer having the stepped portion 106 may be the last layer extending from the flexible region 113 into the rigid region 114, 115, if viewed in stacking direction s towards the second main surface 103 of the stack. The bending stress handling layer 109 may be the first insulating or dielectric layer in stacking direction s towards the second main surface 103 when counted from the electrically insulating layer 106 having the stepped portion 107.

Referring to FIGS. 2 to 6, these figures show structures at various stages of a method of manufacturing a semi-flexible component carrier 100 according to an exemplary embodiment of the invention.

Figure 2:
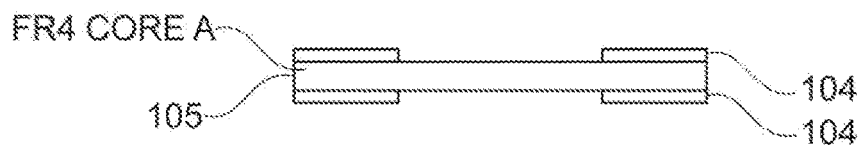
FIG. 2, FIG. 3, FIG. 4, FIG. 5 and FIG. 6 schematically illustrate structures obtained at different stages during manufacture of a semi-flexible component carrier according to an exemplary embodiment of the invention.
Figure 2:
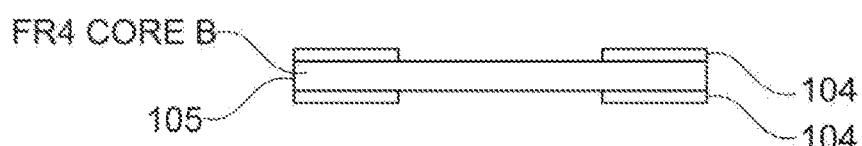

In FIG. 2, a structure is illustrated in which several electrically insulating layer structures 105 and several electrically conductive layers structures 104 are provided. The layer structures may comprise two core layer structures, e.g. an electrically insulating prepreg layer structure, e.g. made from FR4, clad with copper foils on both main surfaces. These core layer structures may be rigid layer structures.

Figure 3:
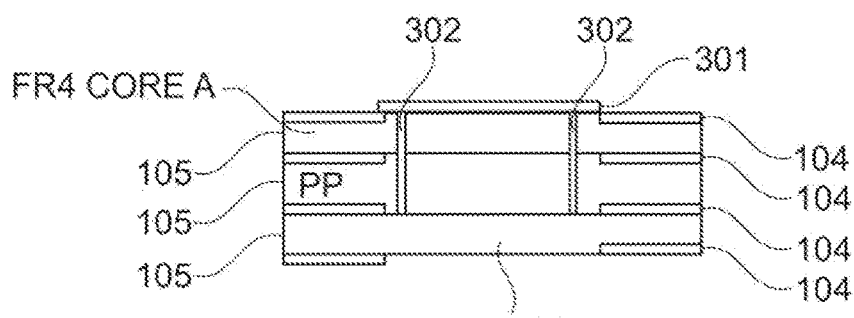

In FIG. 3, a structure is shown, in which the above-mentioned core layer structures are connected by prepreg lamination, i.e. by a further electrically insulating layer structure 105. Precutting holes 302 are provided substantially along the stacking direction s extending up to a main surface of one of the core layer structures. They may be formed as cuts extending from one lateral edge of the core layer structure up to another lateral edge of the core layer structure. The precutting holes 302 may for example be provided by laser drilling or laser cutting. On this same main surface of one of the core layer structures, a release layer 301 is provided covering the precutting holes 302 as well as the area between the precutting holes 302. The release layer 301 may comprise a release ink layer, which may be provided by release ink printing. Also, the release layer 301 may comprise wax, Teflon® and/or tape.

Figure 4:
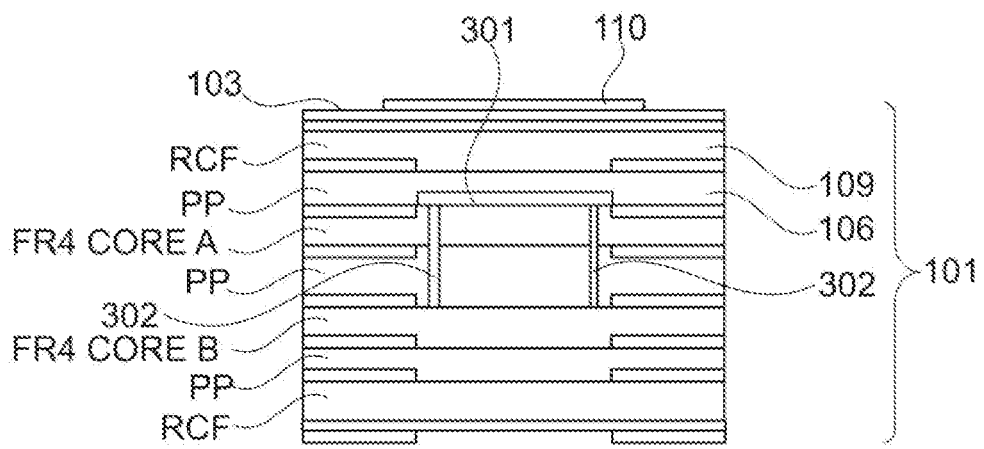

In FIG. 4, a structure is shown, in which further layer structures are built upon at least one of the main surfaces of the structure shown in FIG. 3. These further layer structures may be electrically insulating layer structures 105 or they may be electrically conductive layer structures 104. In particular, one of the further layer structures may be an electrically insulating layer structure 106 comprising a stepped portion 107, where the release layer 301 is located. Another of the further layer structures may be a bending stress handling layer 109, which is arranged on the same side as the electrically insulating layer structure 106 comprising the stepped portion 107 and therefore above the layer structure 106. The stack 101 comprises the structure of FIG. 3 combined with the above-described further layer structures. On a second main surface 103 of the stack 101, a flexible layer 110 may be provided. The flexible layer 110 may comprise a flexible ink layer.

Figure 5:
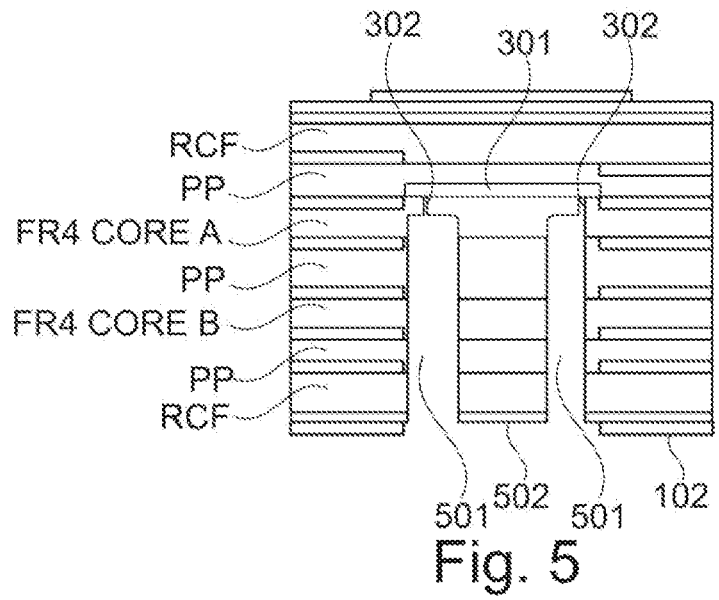

In FIG. 5, a structure is shown, in which cap removal holes or cuts 501 are provided. These cap removal holes 501 extend from the first main surface 102 of the stack into the stack 101 to an extent that they meet the precutting holes 302. The width of the cap removal hole 501 may be sufficiently large such that considerable tolerance is allowed regarding the exact position of the cap removal hole 501 with respect to the respective precutting hole 302 that the cap removal hole 501 aims to meet. Cap removal holes 501 can be provided for example by depth controlled routing or depth routing or by laser drilling. In the process, a cap 502 is formed by the cap removal holes 501, the precutting holes 302, the release layer 301 and possibly lateral edges of the stack 101 or component carrier.

Figure 6:
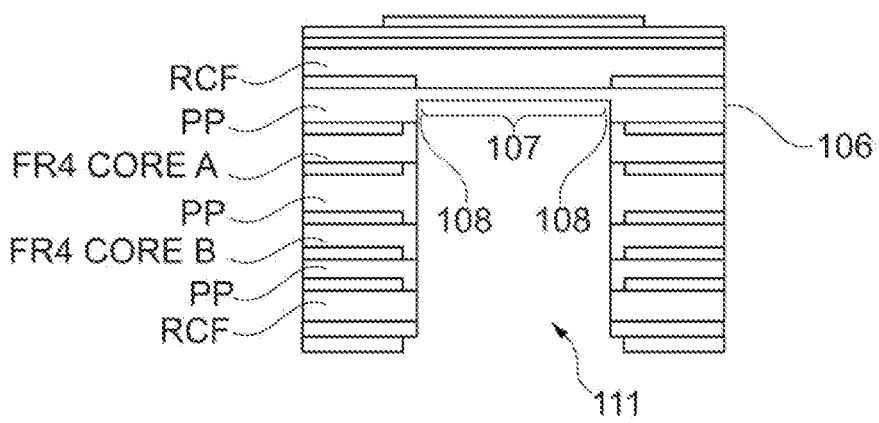

In FIG. 6, a structure is shown, in which the cap 502 of FIG. 5 has been removed to provide a recess 111 with a stepped portion 107 in an electrically insulating layer structure 106. The stepped portion 107 is located, where the release layer 301 was located, which was removed together with the cap 502 and/or after cap removal.

Figure 7:
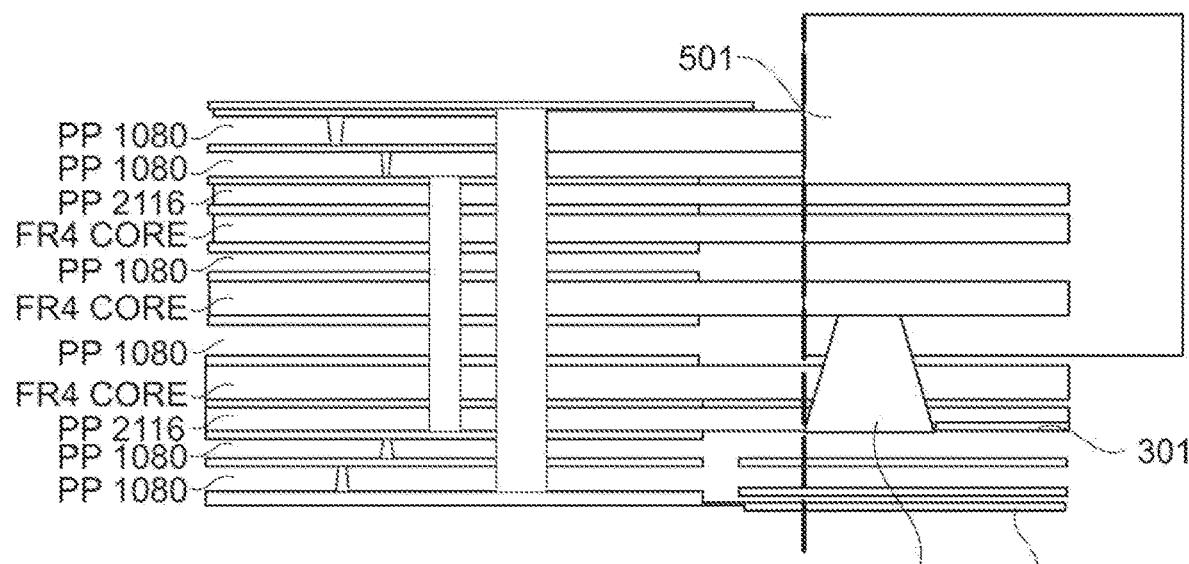
FIG. 7 illustrates a schematic cross-sectional view of a structure obtained during manufacture of a semi-flexible component carrier according to an exemplary embodiment of the invention.

In FIG. 7, yet another structure is shown of a stage during a method of manufacturing a semi-flexible component carrier 100 according to an exemplary embodiment of the invention showing a flexible layer 110, a release layer 301, a precutting hole 302 and a cap removal hole 501.

Figure 8:
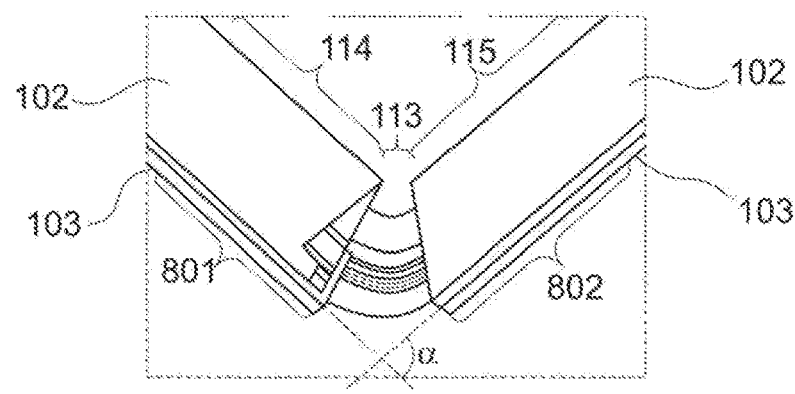
FIG. 8 illustrates a schematic cross-sectional view of a semi-flexible component carrier according to an exemplary embodiment of the invention, in which a flexible region is bent.

In FIG. 8, an exemplary embodiment of the invention is illustrated, in which the rigid region comprises a first rigid region 114 arranged adjacent to a first boundary of a flexible region 113 and a second rigid region 115 arranged adjacent to a second boundary of the flexible region 113 opposite the first boundary. An angle $\alpha$ is formed between a portion 801 of the first main surface 102 in the first rigid region 114 and a further portion 802 of the first main surface 102 in the second rigid region. The angle $\alpha$ is defined such that it is equal to zero, if the first and second rigid regions 114, 115 are not tilted towards each other, that it is greater than zero if the first main surfaces 102 of the rigid regions 114, 115 are tilted towards each other (as shown in the Figure) and that it is smaller than zero if the second main surfaces 103 of the rigid regions 114, 115 are tilted towards each other.

Figure 9:
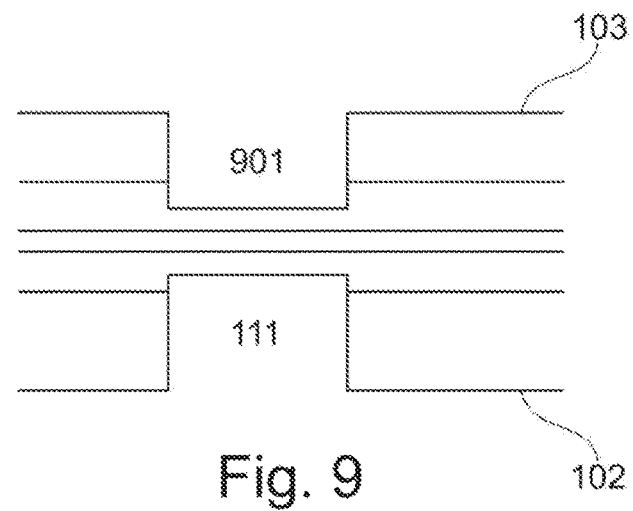
FIG. 9 illustrates a schematic cross-sectional view of a semi-flexible component carrier according to an exemplary embodiment of the invention, in which two recesses are formed from opposite main surfaces of the component carrier.

In FIG. 9, an exemplary embodiment of the invention is illustrated, in which a further recess 901 is formed, which extends partially from the second main surface 103 into the stack 101 and which is arranged substantially opposite the recess 111, which extends partially from the first main surface 102 into the stack.

Figure 10:
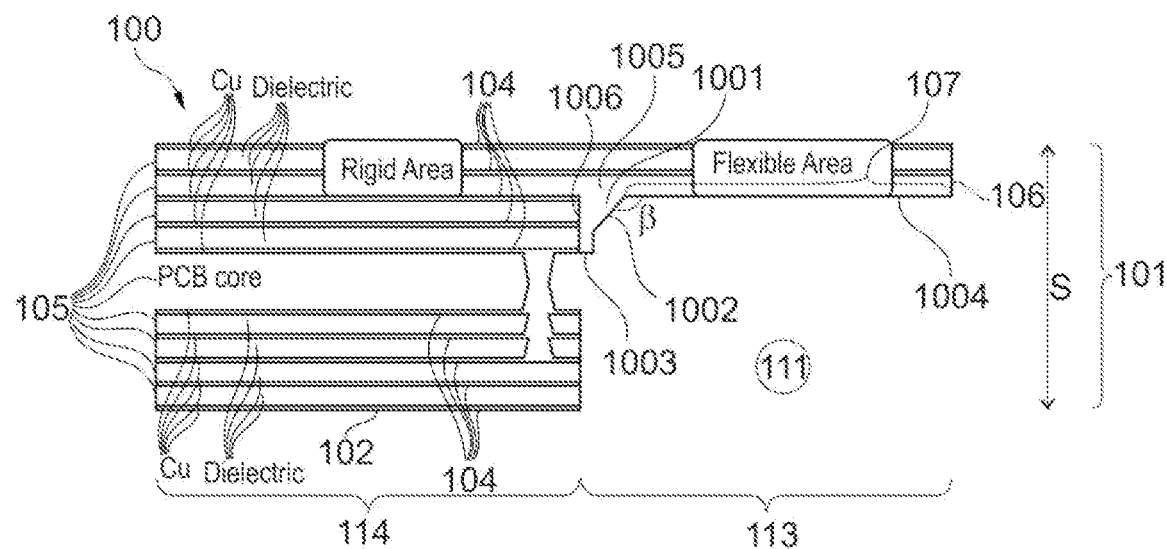
FIG. 10 illustrates a schematic cross-sectional view of a semi-flexible component carrier according to an exemplary embodiment of the invention.

FIG. 10 shows an embodiment of the invention. A semi-flexible component carrier 100 comprises a stack 101 comprising at least one electrically conductive layer structure 104 and at least one electrically insulating layer structure 105, wherein the layer structures are stacked on top of each other in a stacking direction s. Furthermore, the semi-flexible component carrier comprises a recess 111 extending from a first main surface 102 of the stack into the stack 101 and extending only partially into one of the at least one electrically insulating layer structure. Thereby, an electrically insulating layer structure 106 having a stepped portion 107 is formed, wherein the stepped portion 107 provides a flexible region 113 of the stack with respect to a rigid region 114 of the stack.

Both the flexible region 113 and the rigid region 114 extend in a plane perpendicular to the stacking direction s. All layers present in stacking direction in the flexible region 113 belong to the flexible region 113 and all layers present in stacking direction in the rigid region 114 belong to the rigid region 114. All layers in a flexible region 113 may be flexible, if only due to their thinness.

The recess 111 may extend through one or through a plurality of layer structures. It is delimited by the bottom surface 1004 of the stepped portion 107 and by sidewalls which surround the recess 111 and may extend substantially along the stacking direction s. The stepped portion 107 is at least partially delimited by a protrusion 1001 protruding from the bottom surface 1004 of the electrically insulating layer structure 106 having the stepped portion 107. The protrusion 1001 may protrude in stacking direction s along one or several insulating layer structures 105 and/or conductive layer structures 104 of the stack 101.

A lateral surface 1002 of the protrusion 1001 forms at least part of a sidewall of the stepped portion 107 surrounding the recess 111 and hence delimits the stepped portion 107. The lateral surface 1002 is inclined by an angle $\beta$ with respect to the bottom surface 1004 of the stepped portion 107. The angle $\beta$ may be between 120° and 150°. A further lateral surface 1006 of the protrusion, opposite the lateral surface 1002 along a direction perpendicular to the stacking direction s, may also be inclined, but in the opposite direction with respect to the bottom surface 1004 of the stepped portion 107. The angle between the further lateral surface 1006 and the bottom surface 1004 may be between 1° and 89°, in particular between 40° and 50°. The inclination of the lateral surface 1002 and of the further lateral surface 1006 may result from laser cutting.

The protrusion 1001 has a plateau surface 1003, which is substantially orthogonal to the stacking direction s. The plateau surface 1003 is substantially orthogonal to the adjacent sidewall of the recess 111. The plateau surface 1003 delimits the protrusion 1001 in stacking direction s towards the first main surface 102. However, the protrusion 1001 may also extend beyond the plateau surface 1003 in stacking direction s along the sidewall of the recess 111. The plateau surface 1003 may result from a depth routing process.

Referring to FIGS. 11 to 15, structures at various stages of a method of manufacturing a semi-flexible component carrier 100 according to an exemplary embodiment of the invention are shown.

Figure 11:
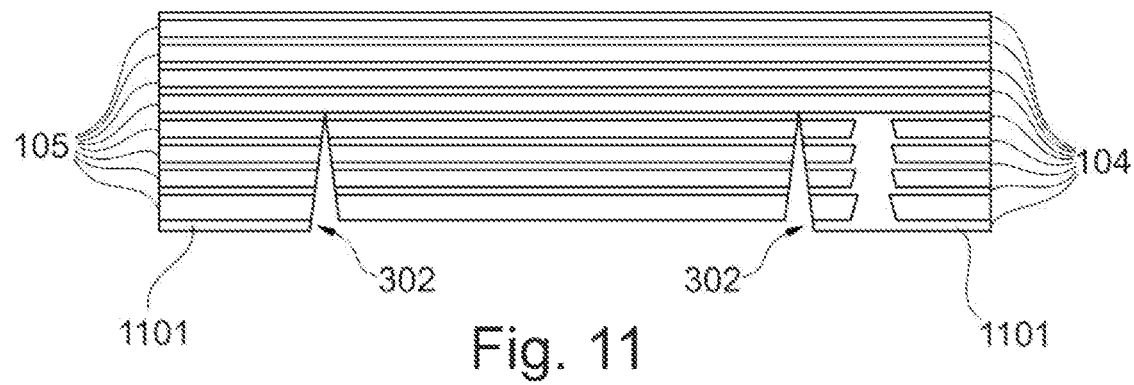
FIG. 11, FIG. 12, FIG. 13, FIG. 14 and FIG. 15 schematically illustrate structures obtained at different stages during manufacture of a semi-flexible component carrier according to an exemplary embodiment of the invention.

In FIG. 11, a stack 101 is shown having layer structures 105 and several electrically conductive layers structures 104. Precutting holes 302 are provided substantially along the stacking direction s extending up to a main surface of the illustrated structure. The precutting holes may be formed as cuts. The precutting holes 302 may for example be provided by laser drilling or laser cutting. Accordingly, the precutting holes 302 may have a substantially triangular profile or a substantially conical form. A covering electrically conductive layer structure 1101 may be provided on the above-mentioned main surface, wherein the covering electrically conductive layer structure 1101 does not cover the region between the precutting holes 302.

Figure 12:
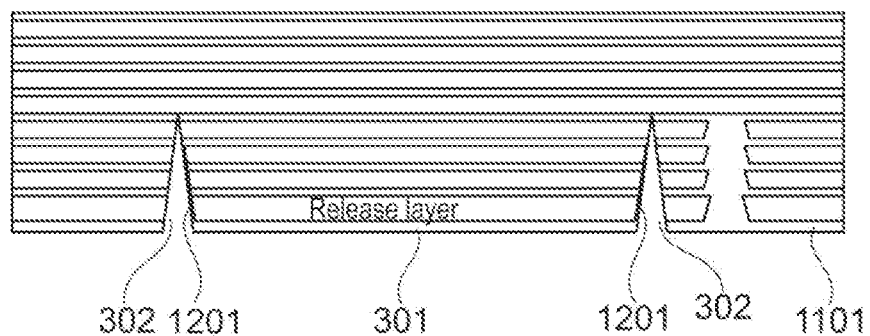

In FIG. 12, a release layer 301 is shown which is applied to the above-mentioned main surface in the region between the precutting holes 302 or precutting paths. The release layer 301 may also cover at least partially the inner surfaces of the precutting holes 302. In particular, the release layer 301 may cover that inner surface of the precutting hole 302 which is adjacent to the region between the precutting holes 302, to which region the release layer 301 is applied. Thereby, a portion 1201 of the release layer 301 covering an inner surface of the precutting hole 302 is formed. This may occur, because the release layer 301 flows from the region between the precutting holes 302 at least partially into the precutting holes 302. The release layer 301 may comprise a release ink layer, which may be provided by release ink printing. Such an ink may be sufficiently liquid such that it will flow into the precutting holes. Also, the release layer 301 may comprise wax, Teflon and/or tape.

Figure 13:
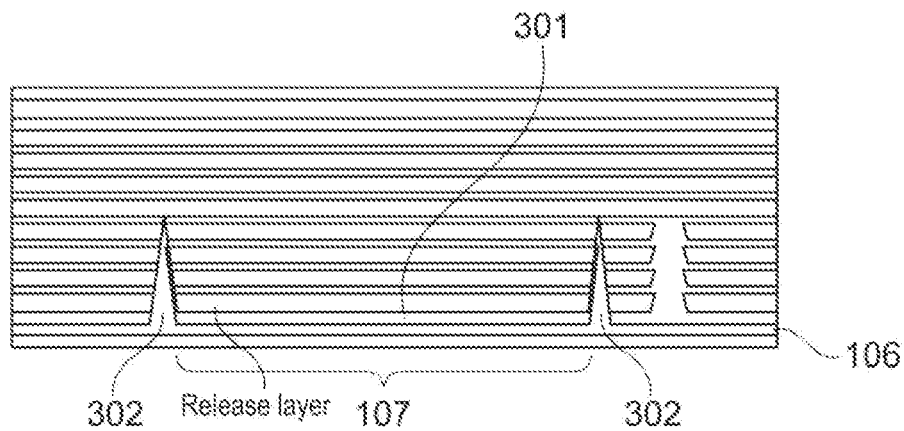

In FIG. 13, further layer structures are built upon at least one of the main surfaces of the structure shown in FIG. 12. In particular, one of the further layer structures may be an electrically insulating layer structure 106 comprising a stepped portion 107, where the release layer 301 is located. The electrically insulating layer structure 106 may be applied with sufficient pressure and/or at sufficiently high temperatures such that resin flows into the precutting holes 302. The electrically insulating layer structure 106 may be laminated onto the release layer 301, the precutting holes 302 and the covering electrically conductive layer structure 1101 such that resin flows into the precutting holes 302, in particular into the laser cutting paths forming the precutting holes 302. The precutting holes are at least partially filled with resin, in particular they may be fully filled with resin. Thus, the electrically insulating layer structure 106 may cover the release layer 301, the covering electrically conductive structure 1101 and fill the precutting holes 302.

Figure 14:
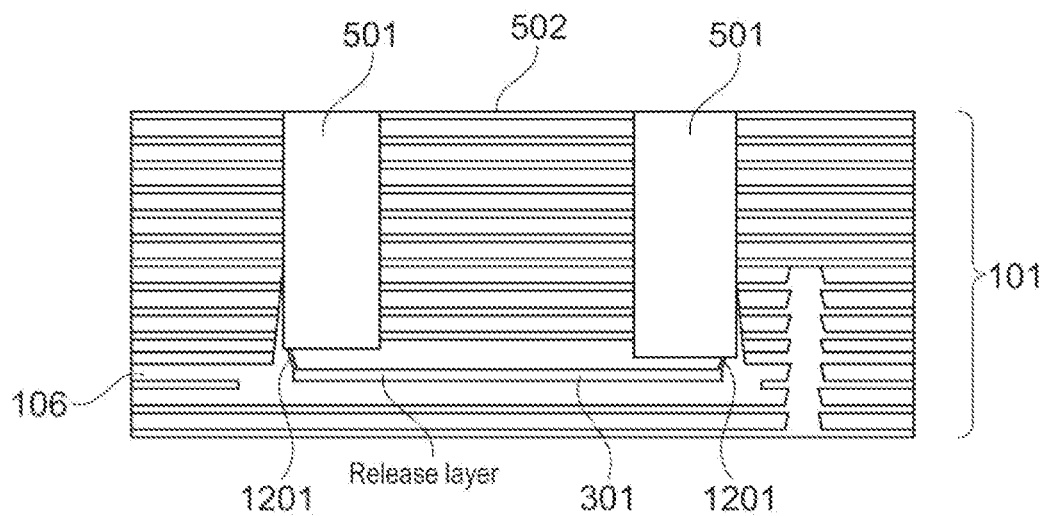

In FIG. 14, further layer structures are built upon at least one of the main surfaces of the structure shown in FIG. 13. These further layer structures may be electrically insulating layer structures 105 or they may be electrically conductive layer structures 104.

Furthermore, cap removal holes or cuts 501 are provided. These cap removal holes 501 extend from the first main surface 102 of the stack into the stack 101 to an extent that they meet the portion 1201 of the release layer 301 covering inner surfaces of the precutting holes 302. The width of the cap removal hole 501 may be sufficiently large such that considerable tolerance is allowed regarding the exact position of the cap removal hole 501 with respect to the portion 1201 of the release layer 301 which the cap removal hole 501 aims to meet. Cap removal holes 501 can be provided for example by depth controlled routing or depth routing or by laser drilling. In the process, a cap 502 is formed by the cap removal holes 501 and the release layer 301 including portions 1201 of the release layer 301 covering inner surfaces of the precutting holes 302, wherein the precutting holes 302 may be filled with material, in particular with resin.

Figure 15:
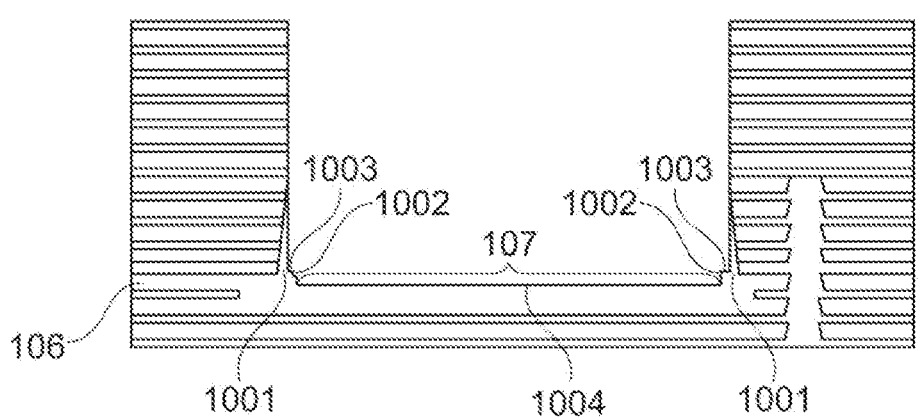
Figure 16:
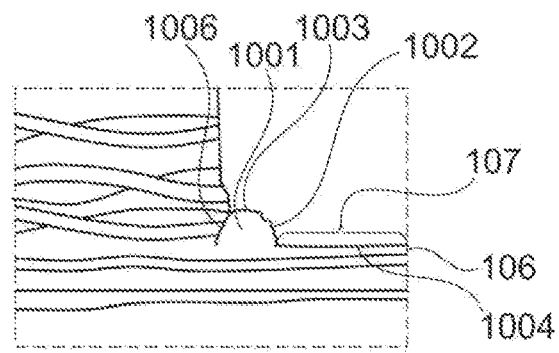
FIG. 16, FIG. 17, FIG. 18 and FIG. 19 are photographical representations of stepped portions delimited by respective protrusions according to exemplary embodiments of the invention.
Figure 17:
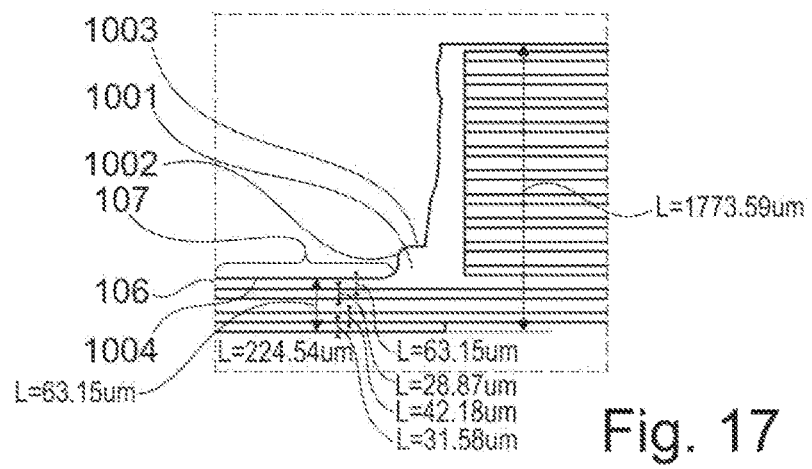
Figure 18:
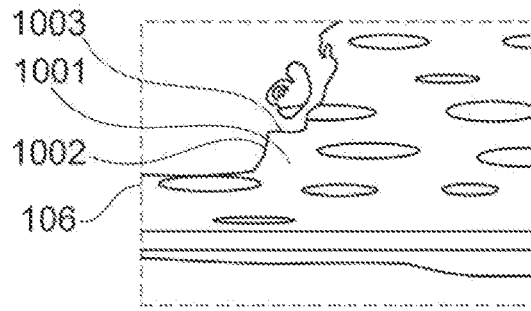
Figure 19:
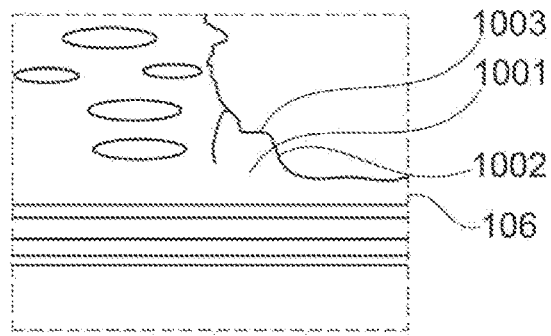

In FIG. 15, the cap 502 of FIG. 14 has been removed to provide a recess 111 which is partially delimited by a stepped portion 107 of an electrically insulating layer structure 106. The stepped portion 107 is located, where the release layer 301 was arranged, which was removed together with the cap 502 and/or after cap removal. In particular, release layer ink may have been stripped away. Protrusions 1001 protruding from the electrically insulating layer structure 106 delimit the stepped portion 107. The protrusions are formed of the material, in particular resin, with which the precutting holes 302 were filled. Lateral surfaces 1002 of the protrusions 1001 delimit the stepped portion 107. The lateral surfaces 1002 correspond fully or at least partially to portions 1201 of the release layer 301 covering inner surfaces of the precutting holes 302, wherein these portions of the release layer have already been removed. Thus, the portions 1201 of the release layer may define predetermined breaking regions, where material of the cap can be detached in a particularly clean and controlled manner. Plateau surfaces 1003 of the protrusions 1001 correspond to portions of the bottom surfaces of the cap removal holes 501.

FIGS. 16 to 19 are representations of stepped portions delimited by respective protrusions according to exemplary embodiments of the invention. Various shapes are shown of protrusions 1001 comprising respective lateral surfaces 1002, plateau surfaces 1003 and further lateral surfaces 1006. Each protrusion 1001 at least partially delimits a bottom surface 1004 of a stepped portion 107 of an electrically insulating layer structure 106 having the stepped portion 107.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

REFERENCE NUMERALS 100 semi-flexible component carrier
101 stack
102 first main surface
103 second main surface
104 electrically conductive layer structure
105 electrically insulating layer structure
106 electrically insulating layer structure having stepped portion
107 stepped portion
108 edge of stepped portion
109 bending stress handling layer
110 flexible layer
111 recess
112 further stepped portion
113 flexible region
114 first rigid region
115 second rigid region 301 release layer
302 precutting hole
501 cap removal hole
502 cap
801 portion of first main surface
802 further portion of first main surface
901 further recess
1001 protrusion
1002 lateral surface
1003 plateau surface
1004 bottom surface
1005 portion, from which protrusion protrudes
1006 further lateral surface
1101 covering electrically conductive layer structure
1201 portion covering inner surface of precutting hole
s stacking direction
α angle between portion and further portion of first main surface
β angle between lateral surface and bottom surface.

The invention claimed is:

1. A semi-flexible component carrier, comprising:
   a stack comprising at least one electrically conductive layer structure and at least one electrically insulating layer structure, wherein the layer structures are stacked on top of each other in a stacking direction;
   a recess extending from a first main surface of the stack into the stack and extending only partially into one of the at least one electrically insulating layer structure so that an electrically insulating layer structure having a stepped portion is formed,
   wherein the stepped portion provides a flexible region of the stack with respect to a rigid region of the stack,
   wherein at least one further stepped portion is formed on at least one of the sidewalls of the recess,
   wherein a step, at which the further stepped portion begins, is located in a layer other than the electrically insulating layer structure having the stepped portion.

2. The semi-flexible component carrier according to claim 1, wherein a flexible layer is arranged above a second main surface of the stack, opposite the first main surface, wherein the flexible layer is arranged in the flexible region.

3. The semi-flexible component carrier according to claim 2, wherein the flexible layer comprises a flexible ink layer.

4. The semi-flexible component carrier according to claim 2, wherein a further recess extending partially from the second main surface into the stack is arranged opposite the recess.

5. The semi-flexible component carrier according to claim 1, wherein a bending stress handling layer extends in the flexible region of the stack.

6. The semi-flexible component carrier according to claim 5, wherein the bending-stress handling layer comprises at least one of the group consisting of resin coated foil (RCF), resin coated copper (RCC) and polyimide (PI).

7. The semi-flexible component carrier according to claim 5, wherein the bending-stress handling layer is
   electrically insulating and
   arranged between a second main surface of the stack opposite the first main surface and the electrically insulating layer structure having the stepped portion,
   wherein the region between the bending stress handling layer and the electrically insulating layer structure having the stepped portion is free of further electrically insulating layer structures.

8. The semi-flexible component carrier according to claim 1, wherein the electrically insulating layer structure having the stepped portion comprises pre-impregnated fibers.

9. The semi-flexible component carrier according to claim 1, wherein a surface of the stepped portion exposed towards the first main surface is free of indentations.

10. The semi-flexible component carrier according to claim 1, wherein the rigid region comprises
    a first rigid region arranged adjacent to a first boundary of the flexible region and
    a second rigid region arranged adjacent to a second boundary of the flexible region opposite the first boundary,
    wherein an angle between a portion of the first main surface in the first rigid region and a further portion of the first main surface in the second rigid region is unequal to zero.

11. The semi-flexible component carrier according to claim 10, wherein the angle between the portion and the further portion is greater than 5 degrees or smaller than −5 degrees.

12. The semi-flexible component carrier according to claim 1, wherein a lateral surface of the protrusion forming at least a part of a sidewall of the stepped portion is inclined with respect to a bottom surface of the stepped portion.

13. The semi-flexible component carrier according to claim 12, wherein the protrusion comprises a plateau surface, wherein the stacking direction is substantially orthogonal to the plateau surface, wherein the plateau surface has greater roughness than the lateral surface.

14. The semi-flexible component carrier according to claim 1, wherein the protrusion comprises a plateau surface, wherein the stacking direction is substantially orthogonal to the plateau surface.

15. The semi-flexible component carrier according to claim 1, wherein the protrusion and a portion of the electrically insulating layer structure, from which the protrusion protrudes, are integrally formed by a resin material.

16. The semi-flexible component carrier according to claim 15, wherein the portion, from which the protrusion protrudes, comprises reinforcement fibers.

17. A semi-flexible component carrier, comprising:
    a stack comprising at least one electrically conductive layer structure and at least one electrically insulating layer structure, wherein the layer structures are stacked on top of each other in a stacking direction;
    a recess extending from a first main surface of the stack into the stack and extending only partially into one of the at least one electrically insulating layer structure so that an electrically insulating layer structure having a stepped portion is formed,
    wherein the stepped portion provides a flexible region of the stack with respect to a rigid region of the stack,
    wherein the electrically insulating layer structure having the stepped portion comprises a protrusion,
    wherein a lateral surface of the protrusion at least partially delimits the stepped portion,
    wherein the protrusion has a further lateral surface opposite the lateral surface.

18. A method of forming a semi-flexible component carrier, comprising:
    forming a stack comprising at least one electrically conductive layer structure and at least one electrically insulating layer structure, wherein the layer structures are stacked on top of each other in a stacking direction;
    forming a recess extending from a first main surface of the stack into the stack and extending only partially into one of the at least one electrically insulating layer structure so that an electrically insulating layer structure having a stepped portion is formed, wherein the stepped portion provides a flexible region of the stack with respect to a rigid region of the stack, wherein at least one further stepped portion is formed on at least one of the sidewalls of the recess, wherein a step, at which the further stepped portion begins, is located in a layer other than the electrically insulating layer structure having the stepped portion.

19. The method according to claim 18, wherein forming the recess comprises:

forming at least one precutting hole extending partially through the stack so that the precutting hole defines the stepped portion, applying a release layer at the stepped portion, wherein the release layer contacts the precutting hole, and forming at least one cap removal hole extending from the first main surface of the stack so that the cap removal hole contacts the precutting hole.

\* \* \* \* \*